United States Patent
Lahner et al.

(10) Patent No.: US 7,082,584 B2
(45) Date of Patent: Jul. 25, 2006

(54) AUTOMATED ANALYSIS OF RTL CODE CONTAINING ASIC VENDOR RULES

(75) Inventors: Juergen Lahner, Sunnyvale, CA (US); Kiran Atmakuri, Sunnyvale, CA (US); Kavitha Chaturvedula, San Jose, CA (US); Balamurugan Balasubramanian, Mountain View, CA (US); Krishna Devineni, Milpitas, CA (US); Srinivas Adusumalli, San Jose, CA (US); Randall P. Fry, Raleigh, NC (US); Gregory A. Pierce, Ashby, MA (US)

(73) Assignee: LSI Logic Corporation, Milpitas, CA (US)

( * ) Notice: Subject to any disclaimer, the term of this patent is extended or adjusted under 35 U.S.C. 154(b) by 408 days.

(21) Appl. No.: 10/427,609

(22) Filed: Apr. 30, 2003

(65) Prior Publication Data

US 2004/0221249 A1 Nov. 4, 2004

(51) Int. Cl.
*G06F 17/50* (2006.01)
(52) U.S. Cl. ...................... 716/4; 716/1; 716/5; 716/18
(58) Field of Classification Search ................... 716/4, 716/1, 18, 5
See application file for complete search history.

(56) References Cited

U.S. PATENT DOCUMENTS

| 5,537,330 | A | | 7/1996 | Damiano |
| 5,555,201 | A | * | 9/1996 | Dangelo et al. ............... 716/1 |
| 6,145,117 | A | | 11/2000 | Eng |
| 6,170,080 | B1 | * | 1/2001 | Ginetti et al. .................. 716/18 |
| 6,289,498 | B1 | * | 9/2001 | Dupenloup ................... 716/18 |
| 6,292,931 | B1 | | 9/2001 | Dupenloup |
| 6,360,356 | B1 | | 3/2002 | Eng |
| 6,378,123 | B1 | | 4/2002 | Dupenloup |
| 6,421,818 | B1 | | 7/2002 | Dupenloup et al. |
| 6,438,730 | B1 | | 8/2002 | Atmakuri et al. |
| 6,601,221 | B1 | * | 7/2003 | Fairbanks ...................... 716/5 |

* cited by examiner

*Primary Examiner*—A. M. Thompson
*Assistant Examiner*—Nelson Lam
(74) *Attorney, Agent, or Firm*—Eric James Whitesell

(57) ABSTRACT

A method of automatically analyzing RTL code includes receiving as input RTL code for an integrated circuit design. An RTL platform is selected that incorporates design rules for a vendor of the integrated circuit design. The design rules are displayed from the RTL platform on a graphic user interface. A number of the design rules are selected from the graphic user interface. An analysis is performed in the RTL platform of the RTL code for each of the selected design rules. A result of the analysis is generated as output for each of the selected design rules.

4 Claims, 13 Drawing Sheets

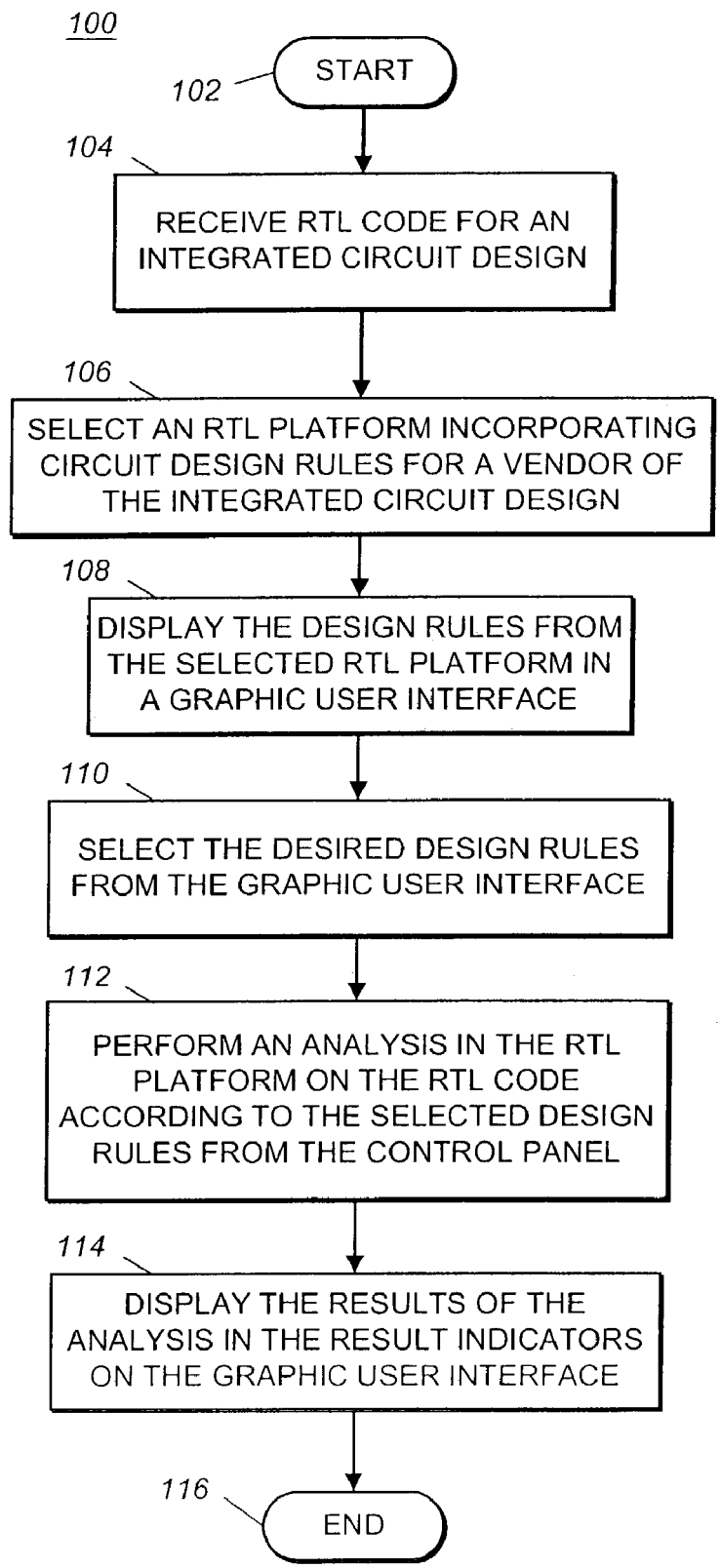
FIG._1

| | | | Severity | Status | Execution | |
|---|---|---|---|---|---|---|
| ☐ | Linting Rules | | Severity | Status | Execution | |
| | ☐ Casex &Casez | | LOW | FAILED | 00:00:01 | Report |
| | ☐ Incompleted Case statements | | LOW | FAILED | 00:00:01 | Report |
| ☐ | Structural/DFT Rules | | Severity | Status | Execution | |
| | ☐ Undefined/Tied Off Clocks | Options | HIGH | PASSED | 00:00:02 | Report |
| | ☐ Gate Clocks | | HIGH | FAILED | 00:00:01 | Report |
| | ☐ Clock To Data | | HIGH | FAILED | 00:00:01 | Report |
| | ☐ Mixed Edge Clocks | | HIGH | PASSED | 00:00:01 | Report |
| | ☐ Clock Domain Crossings | | HIGH | FAILED | 00:00:01 | Report |
| | ☐ Gated Resets | | HIGH | PASSED | 00:00:01 | Report |
| | ☐ Unconstrained I/O | | HIGH | PASSED | 00:00:01 | Report |
| | ☐ Asynchronous Loops | | HIGH | FAILED | 00:00:01 | Report |
| | ☐ Multiple driven Nets | | HIGH | FAILED | 00:00:36 | Report |
| | ☐ Floating/Tied Off Pins | | HIGH | FAILED | 00:00:01 | Report |
| | ☐ Latches | | HIGH | FAILED | 00:00:01 | Report |
| | ☐ Unregistered I/O | Options | HIGH | FAILED | 00:00:01 | Report |
| | ☐ Critical Mux Structures | Options | HIGH | FAILED | 00:00:01 | Report |
| | ☐ High fanout Nets | Options | HIGH | FAILED | 00:00:06 | Report |
| | ☐ Fanin Logic Cone | Options | HIGH | PASSED | 00:00:11 | Report |
| | ☐ Fanout Logic Cone | Options | HIGH | PASSED | 00:00:05 | Report |
| ☐ | Timing Rules | | Severity | Status | Execution | |
| | ☐ Critical Paths | Options | HIGH | FAILED | 00:00:05 | Report |
| | ☐ Local Congestion | Options | | FAILED | 00:00:01 | Report |
| | ☐ Global Congestion | | | FAILED | 00:00:01 | Report |
| ☐ | Information Rules | | Severity | Status | Execution | |
| | ☐ Area Pie Chart | | INFO | DONE | 00:00:01 | Report |
| | ☐ Large Arithmetic Structures | Options | INFO | DONE | 00:00:01 | Report |
| | ☐ Shift Registers | Options | INFO | DONE | 00:00:01 | Report |
| | ☐ Unused Ports | | INFO | DONE | 00:00:01 | Report |
| | ☐ Time Budgeting | | INFO | DONE | 00:00:03 | Report |

LSI Physical RTL Opimization(LSIPRO)

LSIPRO 3.7
Built: 01/28/2003 12:06:43     LSI LOGIC

Analyzing Design: MAIN

Synthesis   : COMPLETE (00:00:03)
Place&Route : COMPLETE (00:01:34)     Total Execution Time : 00:03:04

Run Rules | Status: Finished checking current design stats     Help Close

FIG._2

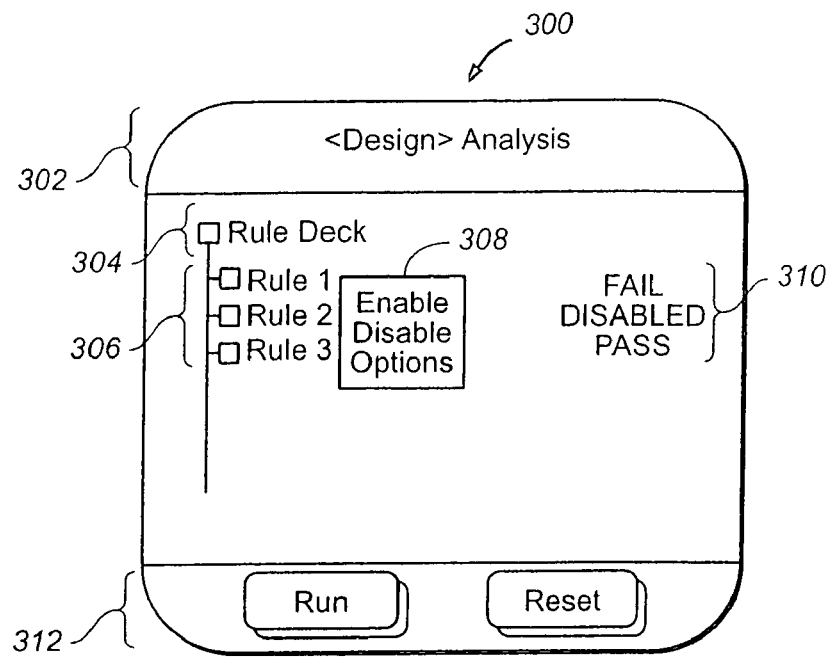
FIG._3
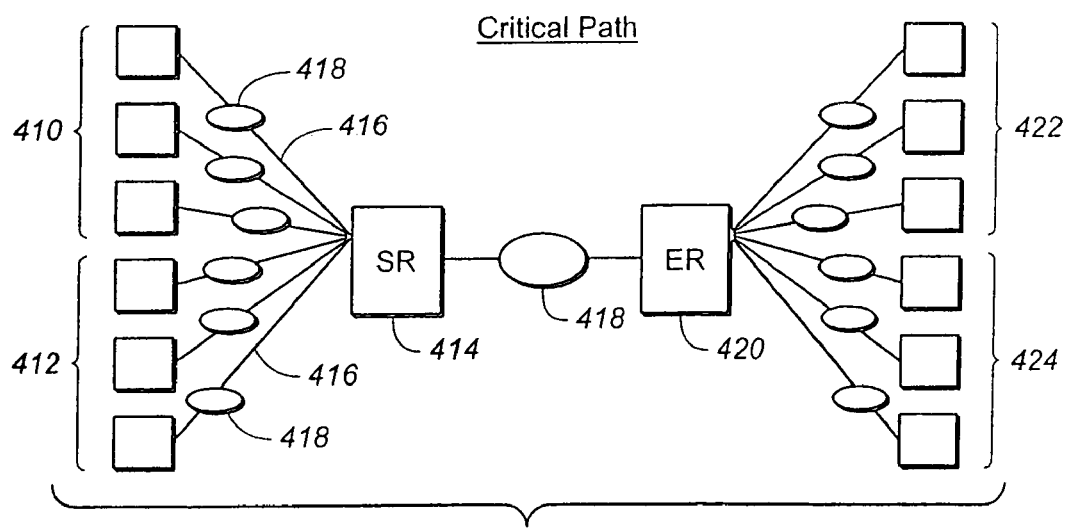
FIG._4A

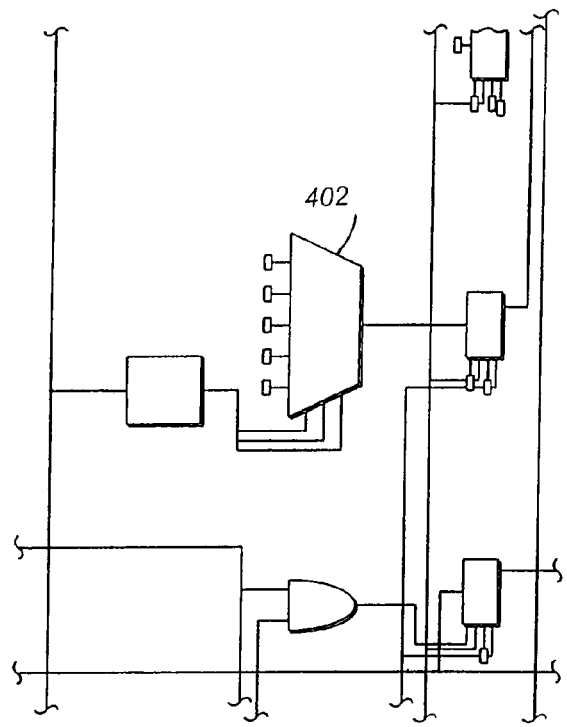
FIG._4B
Central Muxing
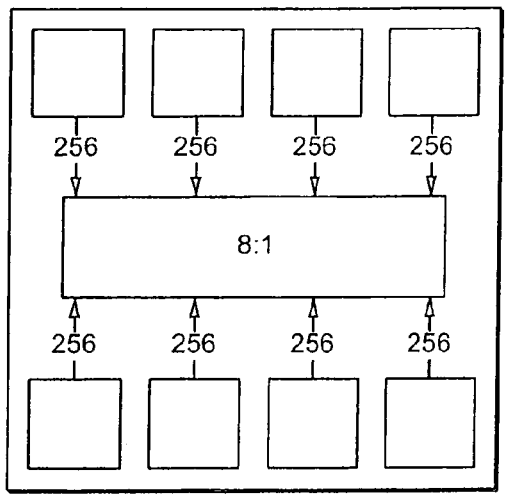
FIG._4C
Local Muxing
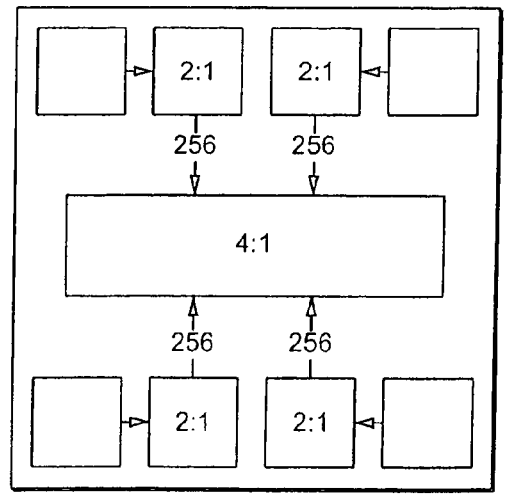
FIG._4D

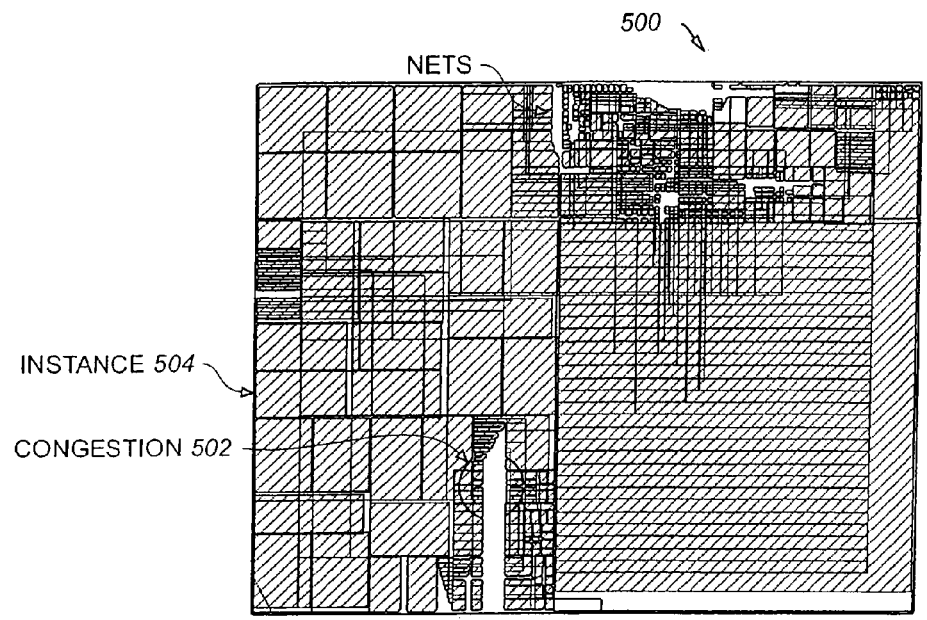
FIG._5
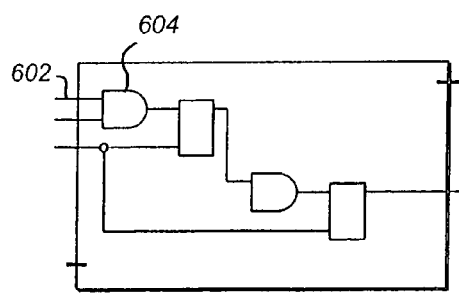
FIG._6
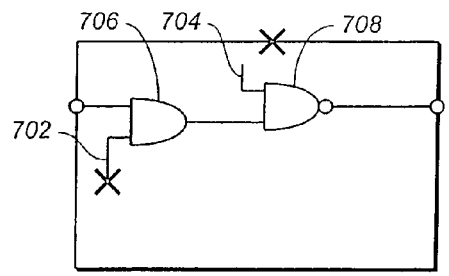
FIG._7

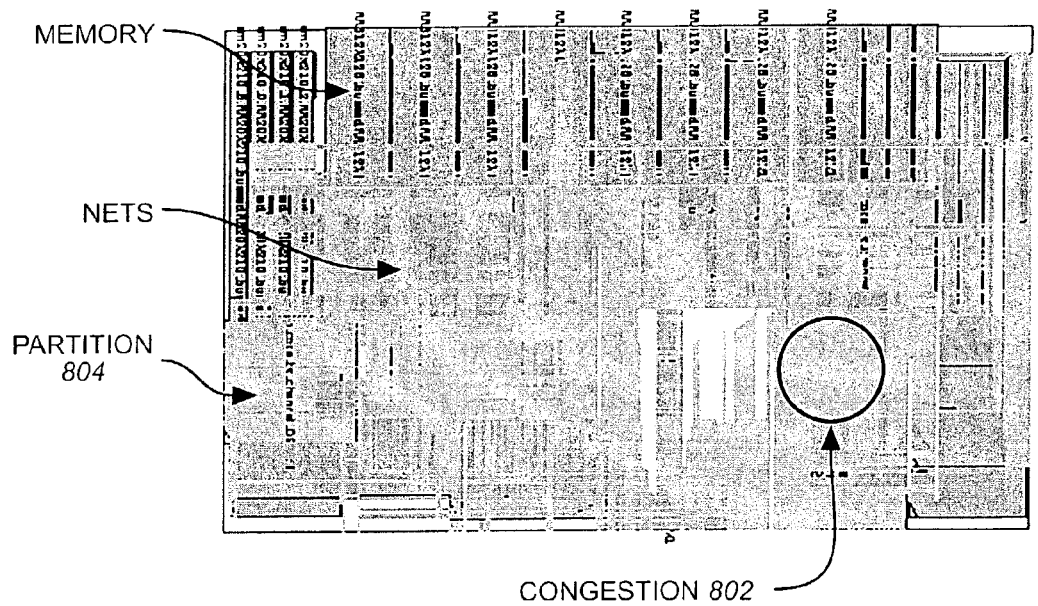
FIG._8
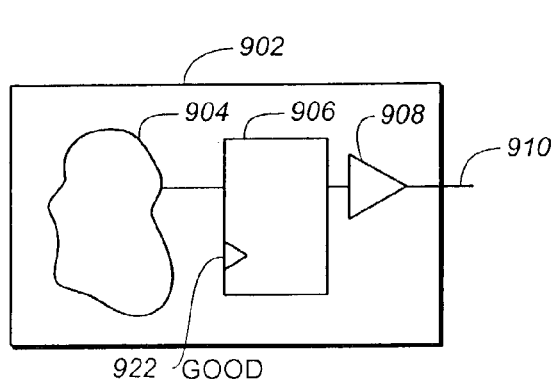
FIG._9A
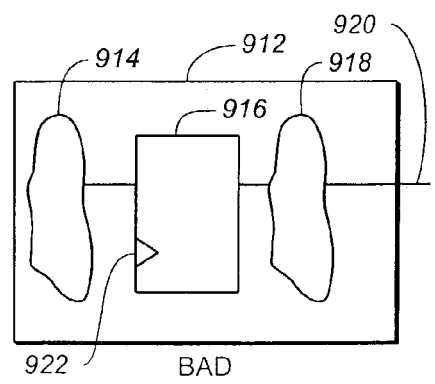
FIG._9B

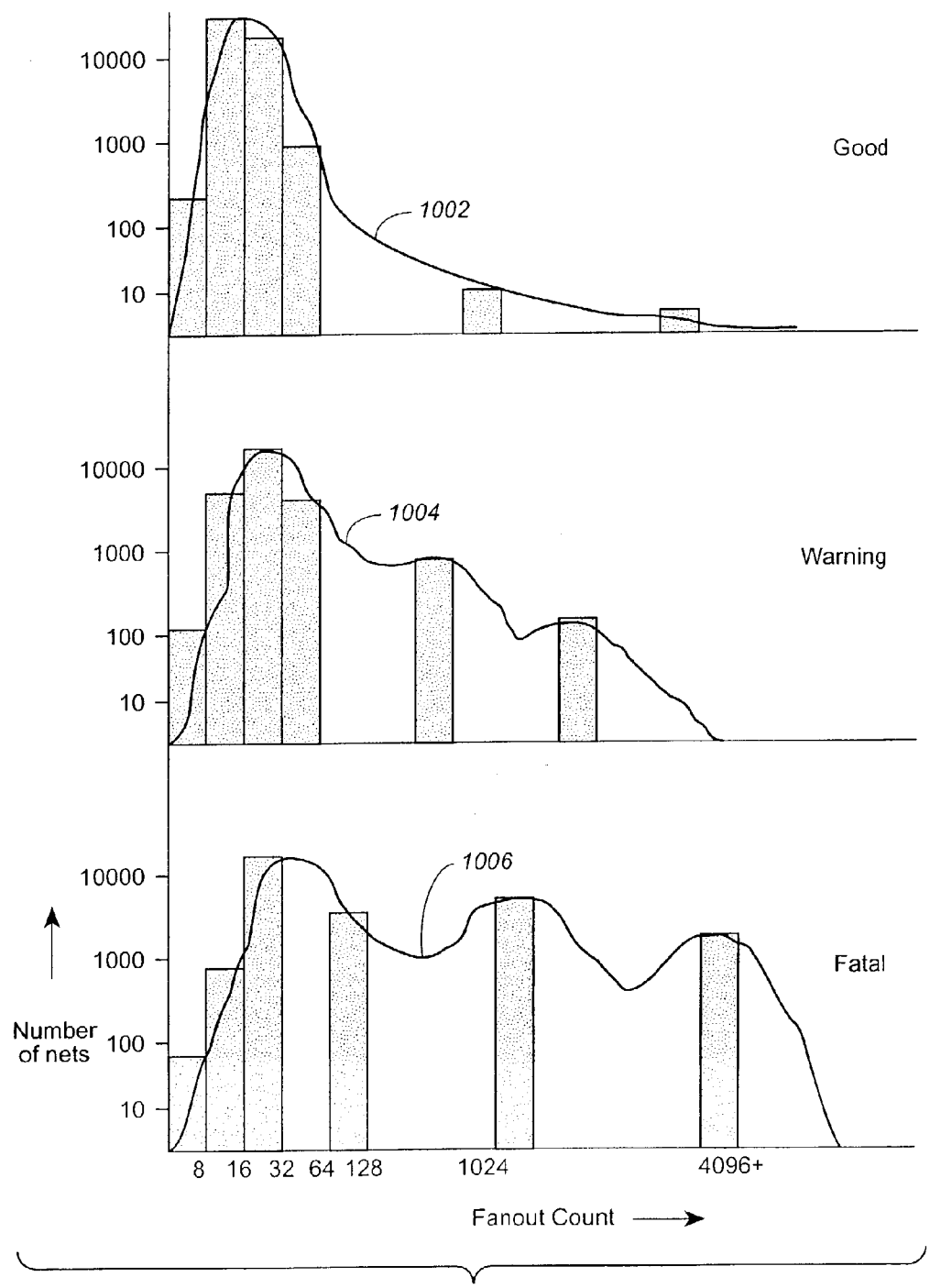
FIG._10A

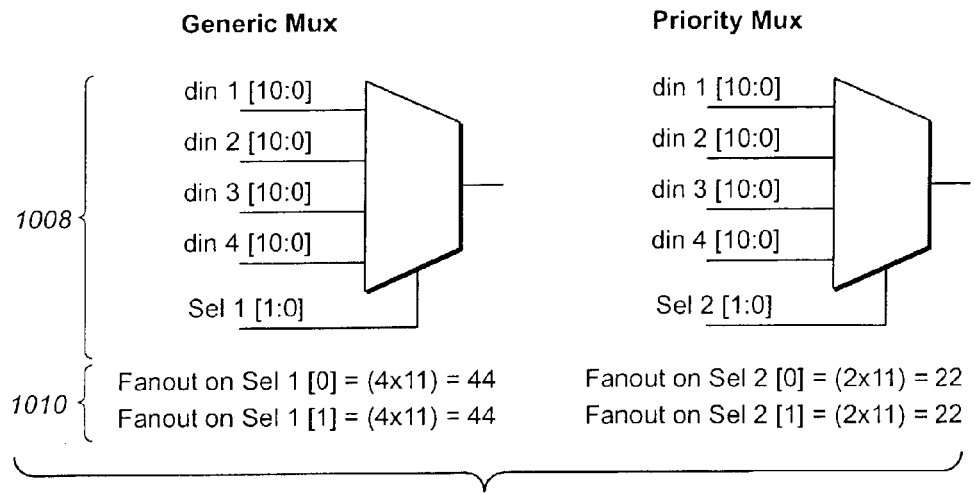
FIG._10B
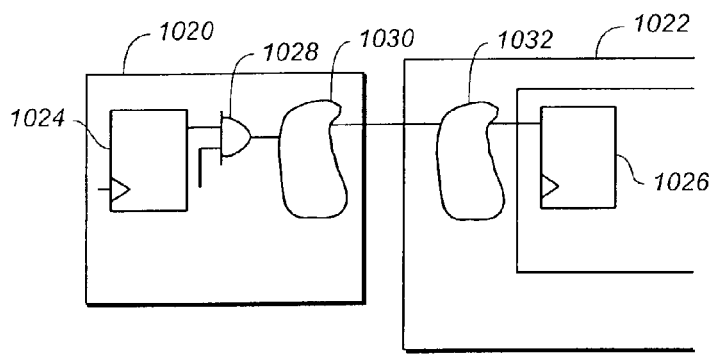
FIG._10C
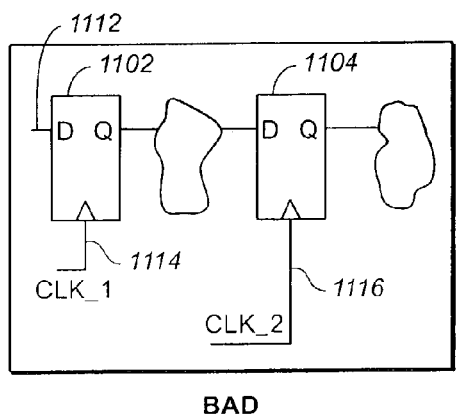
BAD
FIG._11A
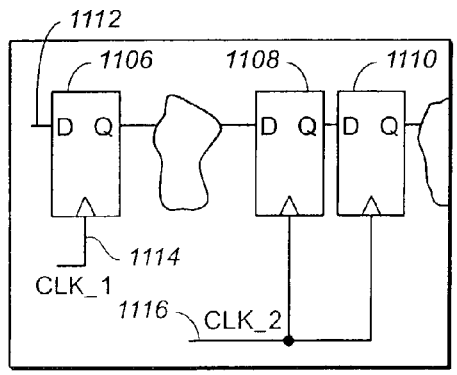
GOOD
FIG._11B

FIG._12
|  | Revision A | Revision B | Percent change |
|---|---|---|---|
| Module A | 1000 | 1100 | +10.0 |
| Module B | 200 | 100 | −50.0 |
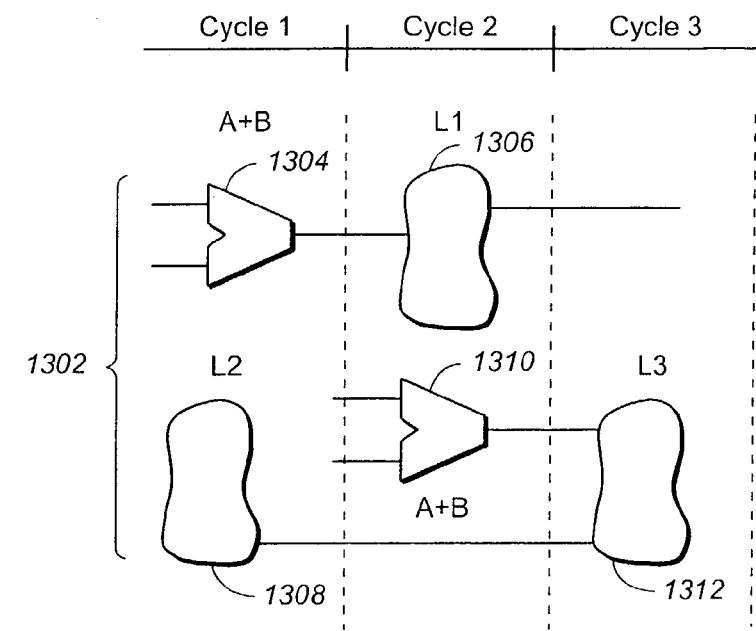
FIG._13A
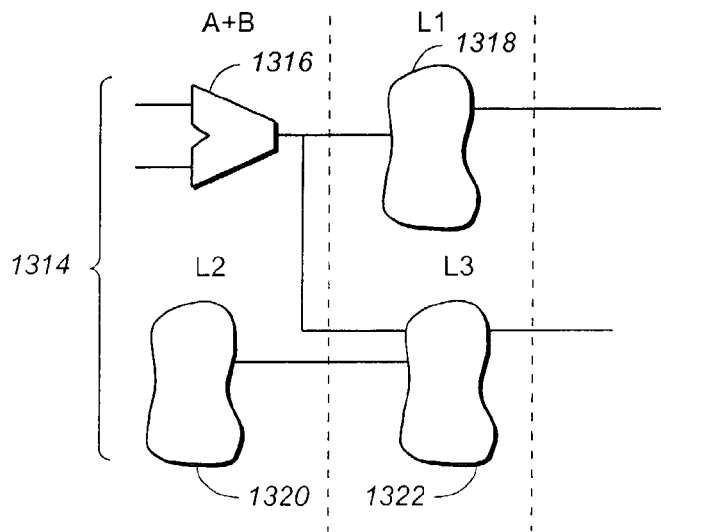
FIG._13B

Rule_S2: Critical Mux structures (3 cell errors) <00:00:03>

| MODULE | AVG_MUX_SIZE | AVG_PINS_PER_MUX | NO_OF_MUXES | IMPACT |
|---|---|---|---|---|
| main.arith | 6:1 | 226 | 2 | fatal |
| main.cntl_logic | 2:1 | 37 | 1 | none |
| main.operation | 2:1 | 10 | 1 | none |
| main.pointer | 21:1 | 648 | 3 | fatal |

1302

| Hierarchical Path | Cell | Type | Inputs | Bitwidth | Module | CLK_Domain | MUX O/P Net | File |
|---|---|---|---|---|---|---|---|---|
| main.arith. rinst7 | GenericMux_in8 | 8:1 | 256 | 32 | arith | main_ext_clk | result[31:0] | x2/arith.v (36 - 45) |
| main.pointer. rinst563 | GenericMux_in31 | 31:1 | 930 | 30 | pointer | main_ext_clk | swizzle_req_ns[29:0] | x2/pointer.v (66 - 100) |
| main.pointer. rinst564 | GenericMux_in31 | 31:1 | 930 | 30 | pointer | main_ext_clk | rx_port_winner_ns[29:0] | x2/pointer.v (175 - 236) |

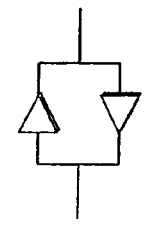

*FIG._14A*

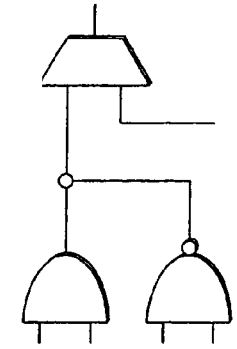

*FIG._14B*

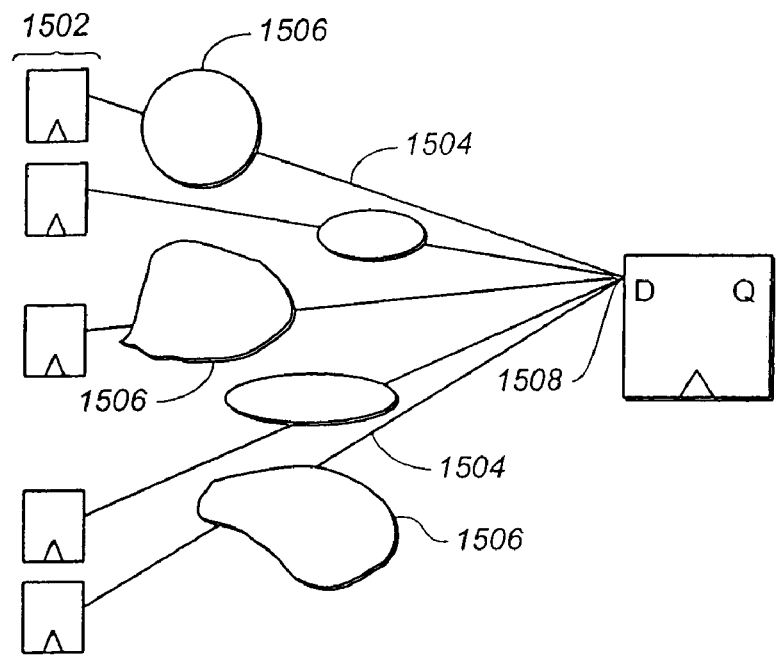
FIG._15
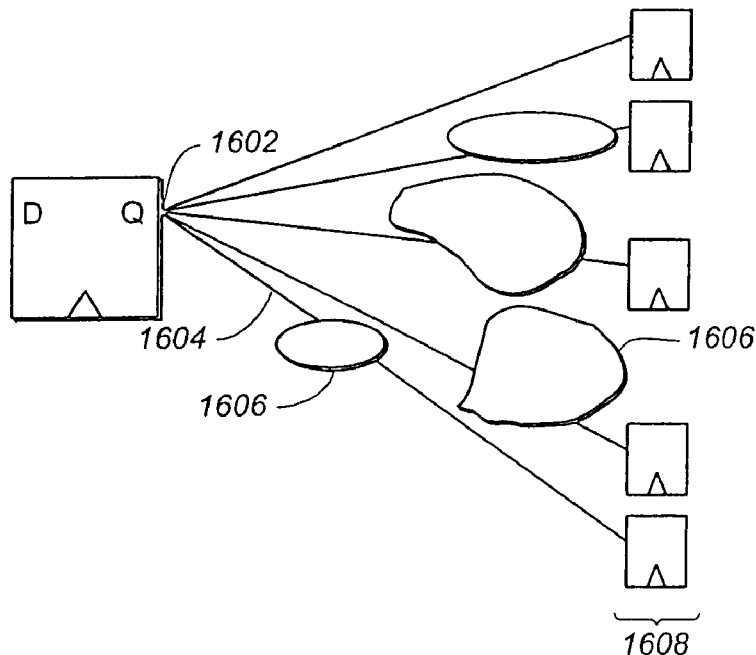
FIG._16

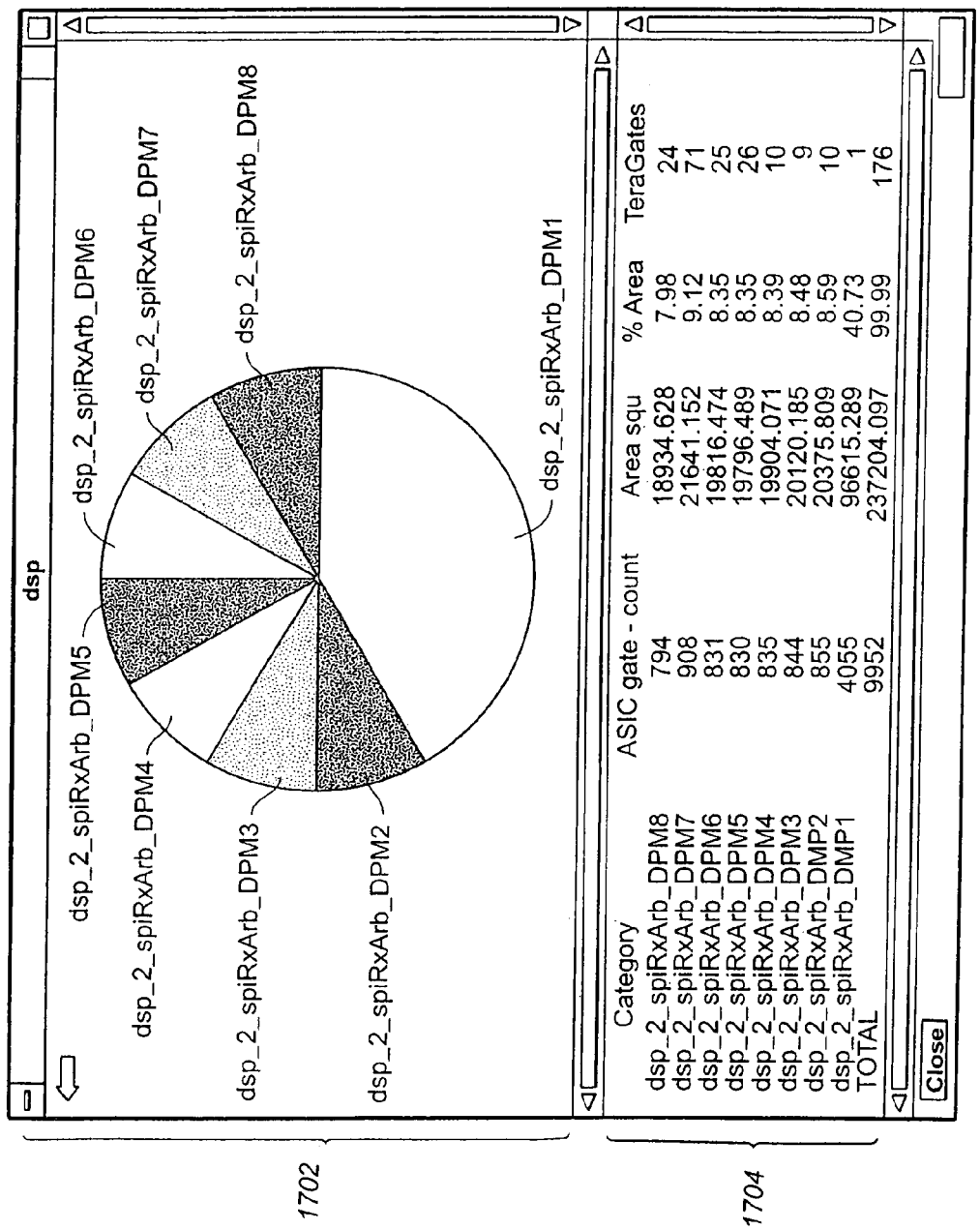
FIG._17

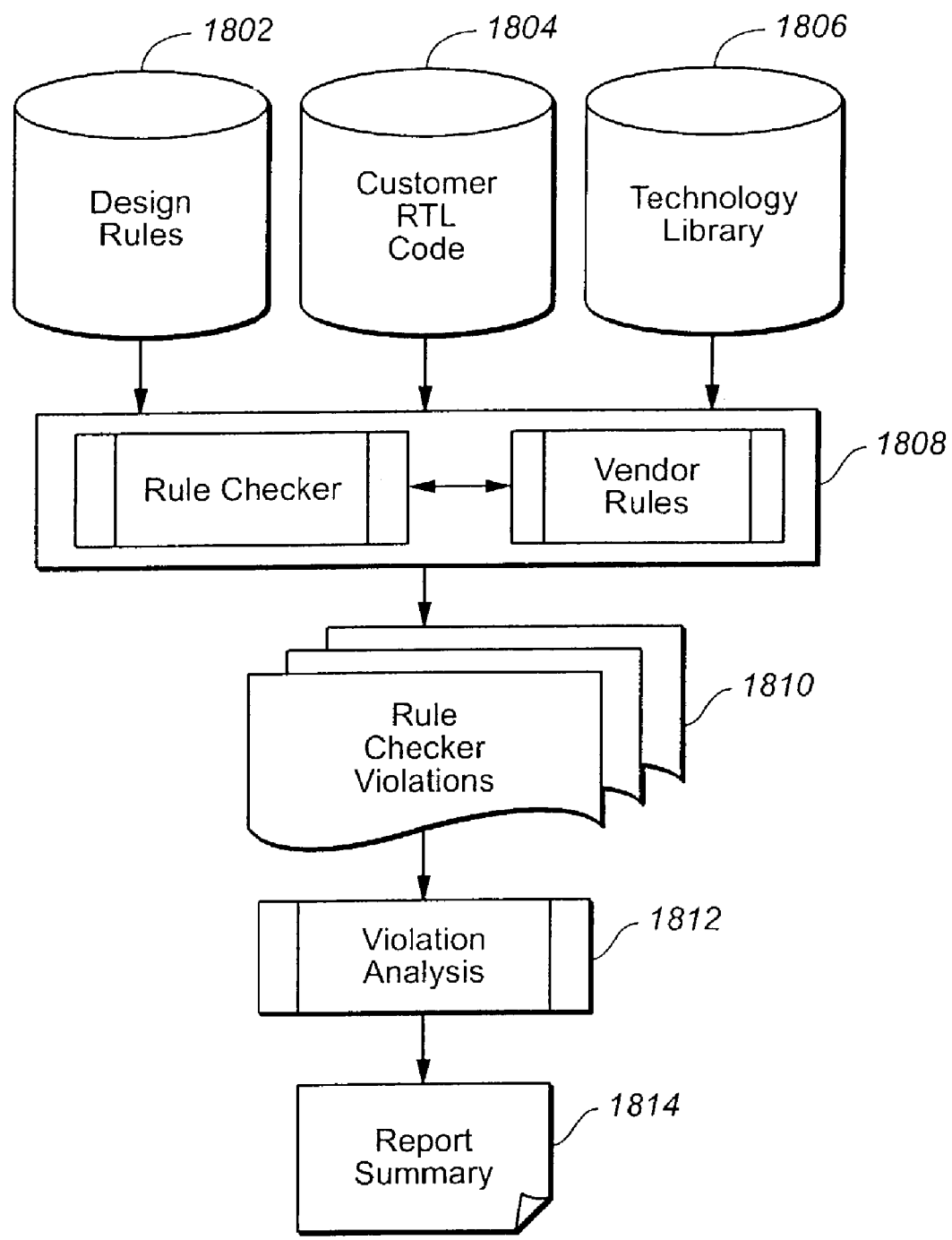
FIG._18

AUTOMATED ANALYSIS OF RTL CODE CONTAINING ASIC VENDOR RULES

BACKGROUND OF THE INVENTION

1. Field of the Invention

The present invention is directed to application specific integrated circuit (ASIC) designs. More specifically, but without limitation thereto, the present invention is directed to identifying and correcting problems in RTL code for an ASIC design.

2. Description of the Prior Art

Previous approaches to correcting design defects in application specific integrated circuit (ASIC) designs require a significant amount of time analyzing the backend flow, or layout, of the ASIC design. Attempting to resolve design problems at this stage in the design typically increases turnaround time (TAT) and jeopardizes schedule commitments.

SUMMARY OF THE INVENTION

In one aspect of the present invention, a method of automatically analyzing RTL code includes steps for receiving as input RTL code for an integrated circuit design, selecting an RTL platform incorporating design rules for a vendor of the integrated circuit design, displaying the design rules from the RTL platform on a graphic user interface, selecting a number of the design rules from the graphic user interface, performing an analysis in the RTL platform of the RTL code for each of the selected design rules, and generating as output a result of the analysis for each of the selected design rules.

In another aspect of the present invention, a computer program product for automatically analyzing RTL code includes a medium for embodying a computer program for input to a computer and a computer program embodied in the medium for causing the computer to perform the following functions:

(a) receiving as input RTL code for an integrated circuit design;

(b) selecting an RTL platform incorporating design rules for a vendor of the integrated circuit design;

(c) displaying the design rules from the RTL platform on a graphic user interface;

(d) selecting a number of the design rules from the graphic user interface;

(e) performing an analysis in the RTL platform of the RTL code for each of the selected design rules; and (f) generating as output a result of the analysis for each of the selected design rules.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a flow chart of an automated RTL code analysis tool according to an embodiment of the present invention;

FIG. 2 illustrates an example of a graphic user interface according to an embodiment of the present invention;

FIG. 3 illustrates an alternative user graphic interface according to an embodiment of the present invention;

FIG. 4A illustrates a critical path reported by the critical paths rule according to an embodiment of the present invention;

FIG. 4B illustrates a large structure rule violation according to an embodiment of the present invention;

FIG. 4C illustrates an example of a large centralized multiplexer structure identified by the large structures rule according to an embodiment of the present invention;

FIG. 4D illustrates an example of a smaller local mux structure partitioned from the centralized mux structure in FIG. 4C;

FIG. 5 illustrates a local congestion rule violation according to an embodiment of the present invention;

FIG. 6 illustrates an unused ports rule violation according to an embodiment of the present invention;

FIG. 7 illustrates a floating pins rule violation according to an embodiment of the present invention;

FIG. 8 illustrates a global congestion rule violation according to an embodiment of the present invention;

FIGS. 9A and 9B illustrate an unregistered outputs rule violation according to an embodiment of the present invention;

FIG. 10A illustrates an example of a fanout histogram displayed by the high fanout report according to an embodiment of the present invention;

FIG. 10B illustrates detailed information displayed with the high fanout report according to an embodiment of the present invention;

FIG. 10C illustrates a logic depth rule violation according to an embodiment of the present invention;

FIGS. 11A and 11B illustrate an asynchronous interfaces rule violation according to an embodiment of the present invention;

FIG. 12 illustrates a gate explosion rule display according to an embodiment of the present invention;

FIGS. 13A and 13B illustrate an example of resource sharing according to an embodiment of the present invention;

FIG. 13C illustrates a critical multiplexer structures report according to an embodiment of the present invention;

FIG. 14 illustrates an example of a multiple driven nets rule violation according to an embodiment of the present invention;

FIG. 15 illustrates an example of a logical cone fanin identified according to an embodiment of the present invention;

FIG. 16 illustrates an example of a logical cone fanout identified according to an embodiment of the present invention;

FIG. 17 illustrates an example of an area pie chart report according to an embodiment of the present invention; and FIG. 18 illustrates an example of software components of a computer program for implementing the flow chart of FIG. 1.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

Automated checking of RTL code has previously been limited to detecting and removing extraneous information, or "lint". Several investigations have determined that most ASIC design defects result from incorrect register transfer level (RTL) coding. Examples of common RTL coding problems are centralized multiplexing of datapath and test structures, centralized control logic of complex finite state machine (FSM) or multiple finite state machine structures, and single-block configuration blocks such as status or configuration registers mapped across the die. These problems may only be resolved in the RTL code.

The expensive and time-consuming process of backend redesign may be avoided by identifying potential problems in the RTL code and solving the problems in the RTL code. The potential problems in the RTL code may be identified by applying ASIC design rules specific to a vendor, for example, linting, structural, timing and placement rules. The design rules may be conveniently selected from a vendor specific graphic user interface (GUI), and the RTL code for an ASIC design may be checked automatically to detect rule violations. An exemplary set of rules defined below may be divided into structural rules, timing and congestion rules, and design information reports.

In one aspect of the present invention, a method of analyzing RTL code includes steps for receiving as input RTL code for an integrated circuit design, invoking an RTL platform appropriate to a vendor of the integrated circuit design, displaying design rules from the RTL platform on a graphic user interface, selecting a number of the design rules from the graphic user interface, performing an analysis in the RTL platform of the RTL code for violations of the selected design rules, and generating as output an indication of any violations of the selected design rules.

FIG. 1 illustrates a flow chart 100 of a method of automated RTL code analysis according to an embodiment of the present invention.

Step 102 is the entry point of the flow chart 100.

In step 104, RTL code for an integrated circuit design is received as input. The integrated circuit design may be, for example, an ASIC design or any other type of circuit design that may be expressed in RTL code.

In step 106, an RTL platform incorporating circuit design rules for a vendor of the integrated circuit design is selected, for example, from a library of RTL platforms for a variety of ASIC vendors. The vendor may be determined, for example, by an identifier in the RTL code or from a setup file.

An RTL platform in the context used herein means a software tool that can read the RTL code, for example, in Verilog format or Verilog Hardware Description Language (VHDL) format. The RTL platform can perform a design check on the RTL code according to a set of design rules contained in the RTL platform, for example, linting, structural rule checking, timing related rule checking, and cell placement rule checking, and wire routing rule checking. The RTL platform may be programmed for a computer according to well known techniques as described in further detail below.

In step 108, the design rules from the selected RTL platform are displayed in a graphic user interface.

FIG. 2 illustrates an example of a graphic user interface 200 according to an embodiment of the present invention. Shown in FIG. 2 are a header 202, rule categories 204, design rules 206, option buttons 208, fail threshold indicators 210, status indicators 212, result indicators 214, and a control panel 216. The graphic user interface 200 may be programmed and displayed according to well known techniques, for example, on a computer.

The header 202 may be used, for example, to identify the RTL code, the ASIC vendor, the time and date, the RTL code analysis tool developer, version number, and other information.

The rule categories 204 identify the various types of design rules available for analyzing the RTL code. All the design rules within a rule category 204 may be selected by the selection box if desired, or individual design rules may be selected within each rule category 204.

Each of the design rules 206 are organized under a corresponding rule category 204. Each design rule 206 names a rule checking function that may be performed in the RTL platform, for example, by a computer. Examples of rule checking functions for an RTL platform are described in further detail below.

The option buttons 208 may be used, for example, to prompt user entries to select or define fail threshold values and the severity level of the violation for a design rule. Each rule has an associated severity level indicator 210. The severity level may be, for example, "high", "medium", "low", "info", "fatal", "warning", and so on according to the impact of the rule on the design and the accuracy of the information provided in the violation reports. A "high" severity level indicates a problem inherent in the design that may require an RTL and/or synthesis strategy to resolve. A "medium" severity level indicates that guidance is needed in optimization and placement of the design. A "low" severity level indicates that a problem may exist in a structure, and further analysis is recommended to discover the actual rule violations. An "info" severity level indicates that a report is generated by the rule to assist in identifying potential design problems and bottlenecks. A severity level of "fatal" indicates a highly severe rule violation, while a severity level of "warning" indicates a mildly severe rule violation.

The status indicators 212 indicate which design rules have been checked during the analysis, and the result indicators 214 indicate the number of rule violations detected in the RTL code.

The control panel 216 is used to initiate various functions from the graphic user interface 202, for example, performing analysis of the RTL code according to the selected design rules 206.

FIG. 3 illustrates an alternative user graphic interface 300 according to an embodiment of the present invention. Shown in FIG. 3 are a header 302, a rule deck indicator 304, design rules 306, an options menu 308, a result indicator 310, and a control panel 312.

The header 302 may be used, for example, to identify the RTL code, the ASIC vendor of the RTL code, the time and date, the RTL code analysis tool developer, version number, and other information.

The rule deck indicator 304 may be used, for example, to identify the set of design rules for a given ASIC vendor.

The design rules 306 name the design rules implemented in the RTL platform associated with the ASIC vendor of the RTL code. Each of the design rules 306 may be selected individually to configure desired options and to display analysis results.

The options menu 308 may be used, for example, to enable and disable a selected design rule and to select fail thresholds for performing the RTL code analysis in the RTL platform.

The result indicator 310 indicates, for example, whether the selected design rule is enabled or disabled and whether the RTL code passed or failed the RTL code analysis for the selected design rule.

The control panel 312 is used to initiate various functions from the graphic user interface 300, for example, performing an analysis of the RTL code according to the selected design rules 306.

In step 110, the desired design rules 206 are selected, for example, from the graphic user interface 200. The design rules 206 may be selected collectively by the selection boxes in the rule categories 204 or individually by the selection boxes in the design rules 206.

In step 112, an analysis is performed in the RTL platform on the RTL code according to the selected design rules from the control panel 216 of the graphic user interface 200. Examples of design rules that may be implemented in an RTL platform according to well known computer techniques include, but are not limited to, the following:

Rule: Missing Clock Information

The missing clock information rule identifies and reports internally generated clock signals that are not traceable back to a source listed in the RTL code list of provided clock signals. If clock signals are multiplexed, one of the clock signals will be identified as a missing clock if a false path is defined in the constraint file. The Missing clock information rule report contains three fields: "Module", "Pin or Port", and "Fanout" for each missing clock signal. A detailed report may also be created in the RTL code workspace/reports directory with further information regarding the fanout of each missing clock signal. A path may be selected in the detailed report to retrieve the clock signal schematic to determine whether the clock signal is in fact internally generated. The missing clock signals are preferably defined in the constraint file for more accurate timing analysis and detailed placement of the design.

Rule: Unconstrained I/O

The unconstrained input/outputs (I/O) rule identifies any input/outputs in the RTL code that are not constrained by a clock signal. Some clock buffer outputs that are instantiated in the RTL code may be reported as unconstrained. The report file includes the module name, I/O direction (input or output), and name of the unconstrained port. All I/O should be constrained by a clock signal to obtain an accurate timing analysis and optimum cell placement.

Rule: Critical Paths

The critical paths rule identifies, for example, the five paths having the least amount of slack, that is, the calculated path time minus the time required by the performance specifications. The default of five paths may be changed by the user to select any desired number of paths. Even though a circuit design may pass with all paths having positive slack, paths within five percent of the clock cycle should be analyzed. Negative slack may be caused, for example, by large structures in the critical path. If the negative slack is 3 ns or more, a problem may be indicated in the RTL design. The user may select the critical path to retrieve the critical path schematic and zoom in to identify instances of individual delays. Any instance in the circuit design having a large delay may be checked in the corresponding RTL code. Sequential arithmetic elements may be made parallel to reduce the delay, provided that the gate count is not unacceptably increased.

Report: Time Budgeting

The time budgeting report provides information about timing bottlenecks reported by the critical paths rule. The time budgeting report displays the number of starting and ending points for the starting register and the ending register of the critical path. Two report windows are generated, one window displaying the critical paths having the greatest amount of positive slack and the greatest amount of negative slack for the starting register, and a second window displaying the critical paths having the greatest amount of positive slack and the greatest amount of negative slack for the ending register.

FIG. 4A illustrates a critical path reported by the critical paths rule according to an embodiment of the present invention. Shown in FIG. 4A are starting points 410 having the greatest amount of positive slack, the starting points 412 having the greatest amount of negative slack, a starting register 414, critical paths 416, logic clouds 418, an ending register 420, ending points 422 having the greatest amount of positive slack, and ending points 424 having the greatest amount of negative slack.

The time budgeting report is helpful in assisting the circuit designer in considering various design options to correct the critical paths, for example, by utilizing positive slack in adjacent paths.

Rule: Large Structures

The large structures rule identifies, for example, large multiplexers in the circuit design having an input bus width exceeding a selected threshold. A default value for the bus width threshold may be, for example, 64. If there is a 2:1 multiplexer having an input bus width greater than 64, this would be reported as a rule violation. Large multiplexers may result in a design problem during layout.

FIG. 4B illustrates a large structure rule violation according to an embodiment of the present invention. The multiplexer 402 in FIG. 4B is an example of a large structure that has several inputs and a single output. Multiplexers (muxes) typically used in the telecommunications industry may have 1,000 inputs, which are large structures likely to result in congestion problems. A large centralized mux structure may be partitioned into smaller local mux structures as illustrated in FIGS. 4C and 4D.

FIG. 4C illustrates an example of a large centralized mux structure identified by the large structures rule according to an embodiment of the present invention.

FIG. 4D illustrates an example of a smaller local mux structure partitioned from the centralized mux structure in FIG. 4C. The repartitioning of the large centralized mux structure in FIG. 4C into smaller local mux structures reduces the congestion and net area resulting from the large centralized mux structure by half.

Rule: Local Congestion

The local congestion rule identifies locally congested areas within floorplanned blocks, that is, congestion due to interconnections among gates internal to each block. The congestion is indicated in terms of pins per area (PPA). If a block is highly congested, a large structure may be the reason. If so, the large structure may be split into smaller gates to reduce the congestion.

FIG. 5 illustrates an example of local congestion 502 identified according to an embodiment of the present invention. Local congestion is congestion resulting from interconnections between cell instances 504 within a module 500.

Rule: Unused Ports

The unused ports rule identifies any ports in the circuit design that are not connected in the RTL code. These may be investigated and removed if not otherwise needed in the design.

FIG. 6 illustrates an unused ports rule violation according to an embodiment of the present invention. The open input 602 of cell 604 is likely to result in unpredictable operation of the circuit, and should be connected to an output or tied to logic zero or one.

Rule: Floating Pins

The floating pins rule identifies any pin of an instance that is not connected to any logic in the RTL code or to logic outside the module. Unconnected or floating pins may result in unpredictable behavior in a circuit design. Any unconnected pins detected in the RTL code should be connected to an output or tied to 0 or 1. Otherwise, the gate should be removed or replaced with a gate that does not have the unconnected pin so that no unconnected pins remain in the circuit design.

FIG. 7 illustrates a floating pins rule violation according to an embodiment of the present invention. In FIG. 7, input pin 702 of AND gate 706 and input pin 704 of NAND gate 708 are unconnected, therefore these pins would be identified and flagged by the rule.

Rule: Global Congestion

The global congestion rule identifies congestion areas at the chip level, that is, between the floorplanned blocks, and flags any of these areas having a congestion that exceeds a fail threshold value given in pins per area (PPA).

FIG. 8 illustrates a global congestion rule violation according to an embodiment of the present invention. The more connections there are between each of the top level sub-modules in the partition 804, the more likely the possibility of global congestion 802. Global congestion problems may be resolved by re-partitioning the circuit design.

Rule: Latches

The latches rule identifies and reports the latches in the circuit design, such as those used in Latch Based Memories. Latch Based Memories are memories constructed of individual latches to provide more design flexibility in specific applications than is available from standard memory designs. The use of functional latches other than those used for test purposes is not recommended in circuit design, because they may create problems during static timing analysis (STA) and testing. If there are functional latches in addition to those used in Latched Based Memories, it is possible that the additional latches are instantiated unintentionally, for example, by an incomplete CASE statement. The latches report provides information about the module in which the latch is instantiated and the corresponding RTL code line number.

Rule: Unregistered I/O

The unregistered I/O rule identifies any input/outputs (I/O) in the circuit design that are not registered, that is, input/outputs that do not have a known timing relative to a clock signal. Unregistered outputs in floor-planned blocks may result in problems in the circuit design because the output signal must receive a valid timing constraint during the synthesis and physical layout stages of the circuit design. Correct back annotation of outputs is complex and usually unsuccessful if the outputs are not registered. Time budgeting the top level of the circuit design without registered outputs has been demonstrated to be extremely complicated and should be avoided if possible. By default, the unregistered outputs rule checks all floor-planned blocks in the circuit design and reports any outputs that are not registered.

FIGS. 9A and 9B illustrate an unregistered outputs rule violation according to an embodiment of the present invention. Shown in FIGS. 9A and 9B are a "good" block 902, a first logic cloud 904, a first flip-flop 906, a buffer 908, a registered output 910, a "bad" block 912, a second logic cloud 914, a second flip-flop 916, a third logic cloud 918, an unregistered output 920, and a clock signal 922.

In FIG. 9A, a signal generated by the first logic cloud 904 in the "good" block 902 is gated by the first flip-flop 906 and buffered by the buffer 908. Because the delays of the first flip-flop 906 and the buffer 908 are included in the library definitions of the flip-flop 906 and the buffer 908, the delay of the output with respect to the clock signal 922 is defined in the RTL code, therefore the output 910 of the buffer 908 is registered.

In FIG. 9B, a signal generated by the second logic cloud 914 in the "bad" block 912 is gated by the second flip-flop 916. Although the delay of the second flip-flop 916 with respect to the clock signal 922 is defined, the output of the third logic cloud 918 with respect to the output of the second flip-flop 916 is not defined with respect to the clock signal 922, therefore the output 920 of the third logic cloud 918 is not registered.

The unregistered I/O report includes information about the unregistered I/O, the driver/load of the I/O, and the fanout of the I/O in a top and a bottom window. The top window provides information about the top level I/O, and the bottom window provides information about the sub-modules according to the number of levels selected by the option. The unregistered I/O rule options may be used to select the levels of hierarchy, for example, between 1 and 8, for which the report of unregistered I/O is generated. An unregistered I/O path may be selected in the report to view the schematic of the corresponding I/O.

Rule: High Fanout Nets

The high fanout nets rule identifies and reports any nets that have a fanout exceeding a selected threshold value specific to the circuit design. The high fanout report includes two windows. The first window provides a histogram of fanout vs. number of nets.

FIG. 10A illustrates an example of a fanout histogram displayed by the high fanout report according to an embodiment of the present invention. Shown in FIG. 10A are a "good" fanout histogram 1002, a "warning" fanout histogram 1004, and a "fatal" fanout histogram 1006.

The X-axis of the fanout histogram is divided into bins of increasing width on a logarithmic scale, for example, 0–8, 8–16, 16–32, and so on. The Y-axis of the fanout histogram indicates the number of nets. Ideally, the fanout width should be highest in the low fanout region and lowest in the high fanout region, as illustrated in the "good" fanout histogram 1002. If the design has a high number of nets in the high end of the net width scale, there may be routing congestion as indicated by the "warning" fanout histogram 1004. If the design has a very high number of nets in the high end of the net width scale, routing congestion is definitely a problem as indicated by the "fatal" fanout histogram 1006. High fanout nets may result in problems in the circuit layout due to extensive buffering and long wires, and nets driving data lines should preferably be planned as data buses.

The second high fanout report window displays a detailed report about the high fanout nets in the RTL code design.

FIG. 10B illustrates detailed information displayed with the high fanout report according to an embodiment of the present invention. Shown in FIG. 10B are a top frame 1008 and a bottom frame 1010.

The top frame 1008 displays information about the data nets having a fanout that exceeds the selected threshold value. The bottom frame 1010 displays information about the user defined clock nets that are not violations, however, the information may be critical regarding clock signals.

A hierarchical path of a net may be selected to display the high fanout net in the schematic. The high fanout nets report includes reset nets, which may be filtered when identifying the critical high fanout nets.

When reporting the fanout for a select signal of a generic or priority tera multiplexer, the anticipated worst possible case numbers are reported after synthesizing the RTL code into gates.

Rule: Shift Registers

The shift registers rule identifies any shift register having a length of more than a selected threshold value. By default, the threshold value may be, for example, six bits. The user may select a shift register in the report to retrieve the schematic of the shift register in the design. Long shift registers may introduce a large number of hold time violations after the placement stage, and addressing these design issues early on in the RTL code may save time in the overall design cycle.

Rule: Logic Depth

The logic depth rule identifies the number of logic levels between flip-flops in the circuit design and reports a number of logic levels exceeding a selected fail threshold value as a rule violation. For a typical circuit design operating at 200 MHZ, the fail threshold value may be, for example, 35. A high number of logic levels between flip-flops in a high frequency design may result in a conflict with timing requirements. Special attention should be paid to logic paths that are in the critical path of the circuit design. If the number of logic levels in these logic paths is too high, the logic may be modified to reduce the number of logic levels.

FIG. 10C illustrates a logic depth rule violation according to an embodiment of the present invention. Shown in FIG. 10C are modules 1020 and 1022, flip-flops 1024 and 1026, logic gate 1028, and logic clouds 1030 and 1032.

The logic clouds 1030 in the module 1020 and 1032 in the module 1022 indicates the number of logic levels, or logic depth.

Rule: Clock Domain Crossings

The clock domain crossings rule identifies and reports paths that cross clock domains. These paths are referred to as asynchronous interfaces and should be avoided, for example, by using a data synchronizer at each clock domain crossing. Asynchronous interfaces may introduce metastable conditions in the circuit design, and synchronizing latches should be used in all asynchronous interfaces.

FIGS. 11A and 11B illustrate an asynchronous interfaces rule violation according to an embodiment of the present invention. Shown in FIGS. 11A and 11B are flip-flops 1102, 1104, 1106, 1108 and 1110, a data signal 1112, and asynchronous clock signals 1114 and 1116.

In FIG. 11A, the output of the flip-flop 1104 is unpredictable because the data signal 1112 propagated from the first flip-flop 1102 may be transitioning when the flip-flop 1104 is clocked by the second clock signal 1116. The unpredictable output of the circuit of FIG. 11A is representative of an asynchronous interfaces rule violation.

In FIG. 11B, flip-flops 1106 and 1108 are clocked by separate clock signals 1114 and 1116. To avoid metastability problems, for example, when the data signal 1112 is changing state between 0 and 1 and does not have a definite value, the flip-flop 1110 is added to the output of the flip-flop 1108 and clocked by the same clock signal 1116 as the flip-flop 1108. The added flip-flop 1110 ensures that the data signal 1112 propagated from the flip-flop 1106 to the flip-flop 1108 is stable during clocking of the flip-flop 1110 by the second clock signal 1116.

The clock domain crossings report includes two windows. The top window displays the number of interfaces between each pair of clock signals. The bottom window displays the flip-flop and clock signal information for each asynchronous interface, which may also be cross-referenced to the schematic. A detailed clock domain crossings report may also be generated in the workspace/reports directory that includes the number of asynchronous interfaces between each clock pair and a list of all asynchronous interfaces in the RTL code.

If a reported asynchronous interface has an associated false path definition, the violation may be ignored.

Rule: Gate Explosion

The gate explosion rule identifies a change in gate count between circuit design revisions. The difference in gate count between design revisions may be displayed as a percentage to indicate possible unintended gate explosions in specific locations of a block or module.

FIG. 12 illustrates a gate explosion rule display according to an embodiment of the present invention. The leftmost column identifies each block or module. The second column lists the gate counts for each module in a previous version of the circuit design. The third column lists the gate counts for each module in the current version of the circuit design. The fourth column lists the change in gate count for each module as a percentage. A large percentage change in gate count may indicate a possible unintended gate explosion in a block or module. The change in gate count may also be displayed, for example, as a pie chart.

Report: Resource Sharing

The resource sharing report identifies logic paths that may benefit from resource sharing. Typical circuit designs have arithmetic operations that are instantiated by arithmetic components such as adders, multipliers, dividers, and so on. If resource sharing is not explicitly defined, these components may be instantiated for each arithmetic operation, resulting in increased gate count and area in cases where some of the components may have been shared. In cases where some components may be shared, resource sharing can also reduce the timing path.

FIGS. 13A and 13B illustrate an example of resource sharing according to an embodiment of the present invention. Shown in FIGS. 13A and 13B are a block 1302 without resource sharing, a first adder 1304, a first logic cloud 1306, a second logic cloud 1308, a second adder 1310, a third logic cloud 1312, a block 1314 with resource sharing, a third adder 1316, a fourth logic cloud 1318, a fifth logic cloud 1320, and a sixth logic cloud 1322.

The block 1302 without resource sharing performs the same function as the block 1314 with resource sharing, however the third adder 1316 is shared in the block 1314 with resource sharing by the fourth logic cloud 1318 and the sixth logic cloud 1322. Not only does resource sharing reduce the gate count by the second adder 1310, but also the timing path has been reduced from three clock cycles to two clock cycles in the block 1314 with resource sharing.

Rule: Use of Casex/Casez (Verilog)

The use of casex/casez rule is a Verilog linting rule that reports casex/casez statements used in the RTL code even if they are used with the synopsis full case or parallel case directives. The Use of casex/casez rule reports the type of case statement used and the line number of the statement in the RTL code. The synopsis directives can change the functionality of the design, resulting in a mismatch between the pre-synthesis and post-synthesis simulation. "x/z" or "?"

are used as wild cards representative of any possible characters when used in case expressions, which may infer priority encoders if more than one case item matches the same value.

Rule: Incomplete Case Statements (Verilog)

The incomplete case statements rule reports Verilog case statements that do not include a default statement. The Incomplete case statements rule examines each case statement in the RTL code and determines whether a default statement is included without regard to any attached synopsis directives. The case statements are reported with their respective line numbers in the RTL code. A latch may be inferred if the case statement is incomplete.

Rule: Gated Clocks

The gated clocks rule determines the driver of each clock network and reports the clock signal if it is driven by a gate, including inverters. The gated clock report includes the following fields: clock net, module, instance, pin and hierarchical path of the driving instance, and the RTL code information. The Gated clocks rule identifies testability and placement problems in the circuit design, so that information about the gated clocks may be forwarded to a physical design center.

Rule: Clock to Data

The clock to data rule reports any clock signals that fanout to a non-clock input pin of a register, memory, or "blackbox". The Clock to data rule works in conjunction with the Missing clock information and Gated clock rules to provide sufficient information to, for example, the RTL code design engineer and the vendor to determine whether all appropriate block information is present and that all clocks have been implemented and modeled accordingly.

Rule: Mixed Clock Edges

The mixed clock edges rule reports whether both the rising edge and the falling edge of a clock signal is used. The report includes the following information: clock net, number of positive edge flip-flops driven by the clock signal, number of negative edge flip-flops driven by the clock signal, and the hierarchical path of the clock driver. A detailed report may also be generated in the workspace/reports directory including information about the positive edge and negative edge flip-flops driven by each of the clock signals found in violation of the rule. Clock signals that are used on both the rising edge and the falling edge are frequently problematic during testing analysis. Synthesis scripts may have to be modified to include the false path definitions on data transfer paths between these clock signals.

Rule: Critical Mux Structures

The critical mux structures rule finds multiplexers in the design that have an input bus exceeding a selected threshold. The Critical mux structures rule has two options, one for the logic level and another for the input pins threshold. A default value for the input pins threshold may be, for example, 256 inputs. Also, if there is a 2:1 multiplexer having a total number of cell pins that exceeds a selected threshold value, it will be reported as a violation of the rule.

The logic level option has two values: Chip and Module. The default is preferably Chip, which assumes that each of the top level sub-modules is a partition or a floor plan block. If the logic level option is changed to Module, the impact summary is provided at the top level instead of for the sub-modules. The critical mux structures report window may be divided into two parts, a top window and a bottom window.

FIG. 13C illustrates a critical mux structures report according to an embodiment of the present invention.

The top window 1302 displays an impact summary for each top level sub-module, including the average multiplexer size in the module, average mux pin count in the module, and the total number of multiplexers in the module. From these parameter values, an impact status of "NONE", "WARNING" or "FATAL" is generated for each module.

If the impact is "NONE", the collective impact of the multiplexers in the corresponding module on routing and layout is minor, and it is unlikely that the multiplexer structures in the module will result in routing congestion. However, there may be other violations in the module, such as high fanout nets or the select lines of several multiplexers being driven by the same source, and so on.

If the impact is "WARNING", the presence of several medium-size multiplexers or a large number of small multiplexers is indicated, which may result in routing congestion from the placement of the multiplexers. It is likely that this module will contribute to congestion problems. The Critical mux structures rule may be used in conjunction with other rule reports, for example, high fanout nets, local congestion, and the area pie chart for the corresponding module to determine whether congestion will definitely be a problem.

If the impact is "FATAL", the presence of very large multiplexers or a very high concentration of small/medium multiplexers is indicated, which will almost certainly result in routing congestion from the placement of the multiplexers. The routing congestion may be worse if there are any high fanout nets in the same module. The RTL design should preferably be repartitioned so as to distribute the multiplexers and use of large multiplexers should generally be avoided.

The bottom window 1304 in the critical mux structures report includes information about the large multiplexers for each module. The information in the top and bottom windows may be helpful in correcting problems in the design resulting from large multiplexer structures. The hierarchical path of the multiplexer nay be selected from the report window to view the schematic and ascertain that the multiplexer is in fact a large multiplexer.

Rule: Gated Reset

The gated reset rule reports any reset signals in the design that are propagated through a gate. The reset signals are traced back from the clear pins of the flip-flops. If the source of a reset signal is a gate, the reset signal is flagged and reported. The gated reset report includes two parts: a top window and a bottom window.

The top window of the gated reset report identifies reset nets driven by gates other than inverters or buffers, and the bottom window identifies reset nets that are driven by inverters or buffers. The report includes the following fields: reset net, module, instance, pin, type and hierarchical path of the driving instance, and RTL code information. The Gated reset rule identifies testability and placement problems, and information about the gated reset drivers and fanout may be forwarded to a physical design center for further evaluation.

Rule: Asynchronous/Combinational Loops

The asynchronous/combinational loops rule identifies any combinational loops in the RTL code design. Combinational loops result in problems during testing and static timing analysis (STA), and should be avoided entirely in the RTL code design. Even a single combinational loop in the RTL code is reported as a fatal error. The RTL code should be modified accordingly to correct such an error.

The Asynchronous/combinational loops report displays the starting and ending points in the loop. A detailed report may be generated in the workspace/reports directory that includes information about each of the loops. Loops containing black boxes should be checked to determine whether the loops are in fact combinational loops. In case of black boxes without any clock pin, it is assumed there is a combinational path that exists between the starting and ending points in the loop.

Rule: Multiple Driven Nets

The multiple driven nets rule identifies and reports nets driven by more than one driver. Multiple driven nets may result in driver conflicts and should be avoided, including tri-state buffers. If the RTL code infers any tri-state buffers, they will be flagged as errors and not mapped to a library cell.

FIGS. 14A and 14B illustrate examples of a multiple driven nets rule violation according to an embodiment of the present invention. FIG. 14 illustrates a wired-OR circuit, and FIG. 14B illustrates two buffers connected input to output.

The wired-OR circuit in FIG. 14A may result in a gate output conflict if the outputs of the AND and NAND gates are not identical. The buffer loop in FIG. 14B will result in a gate output conflict if the input signal to the buffer loop changes state.

The multiple driven nets report includes a top portion and a bottom portion. The top portion lists all nets having more than one driver and the associated driver pin hierarchical path information. The bottom portion displays the multiple driven nets that are driven by more than one instance of pins, one of which may be floating. This information is provided to flag potentially multiple driven nets when the floating pins are connected with added functionality.

Rule: Logical Cone (Fanin)

The Logical cone (fanin) rule reports flip-flops in the RTL code having a fanin of more than, for example, 500 starting points. A warning is generated if there are more than 500 starting points, and an error is reported if there are more than 1000 starting points.

FIG. 15 illustrates an example of a logical cone fanin identified according to an embodiment of the present invention. Shown in FIG. 15 are starting points 1502, logic paths 1504, logic clouds 1506, and an ending point 1508.

Because each register is considered as a function of its inputs, a large number of starting points 1502 requires a large number of input vectors to verify the testability of the circuit design. Also, there will be a large amount of logic connected to the register at the end point 1508, which may result in high congestion and extra buffering to compensate for non-ideal placement. Further, a large logical cone fanin may result in timing closure problems if the starting points 1502 are all near the critical path limit, because the delay of one logic path 1504 may not be shortened without increasing the delay of another.

Control points may be added to the logic as part of the RTL code or test insertion to improve the testability of the design. More aggressive, that is, tighter synthesis constraints may help to resolve timing closure problems due to large logical cone fanins.

Rule: Logical Cone (Fanout)

The Logical cone (fanout) rule reports flip-flops in the RTL code having a fanout of more than, for example, 500 ending points. A warning is generated if there are more than 500 ending points, and an error is reported if there are more than 1000 starting points.

FIG. 16 illustrates an example of a logical cone fanout identified according to an embodiment of the present invention. Shown in FIG. 16 are a starting point 1602, logic paths 1604, logic clouds 1606, and ending points 1608.

A large number of ending points 1608 increases the difficulty of verifying the testability of the circuit design. Also, there will be a large amount of logic connected to the register at the starting point 1602, which may result in high congestion and extra buffering to compensate for non-ideal placement. Further, a large logical cone fanout may result in timing closure problems if the ending points 1608 are all near the critical path limit, because the delay of one logic path 1604 may not be shortened without increasing the delay of another.

An example of logic that can infer high fanout rule violations is a barrel shift register. Observation points may be added to the logic as part of the RTL code or test insertion to improve the testability of designs having a large logic cone fanout. More aggressive, that is, tighter synthesis constraints may help to resolve timing closure problems due to large logical cone fanouts.

Rule: Large Arithmetic Operators

The large arithmetic operators rule identifies and reports arithmetic structures such as adders, subtractors, multipliers, bitwise AND, and bitwise OR having a number of inputs exceeding a selected threshold, for example, 64. The number of inputs is calculated by multiplying the number of input channels times the bitwidth of each channel.

After analyzing the RTL code in the RTL platform according to the design rules selected in the graphic user interface 200, the results of the analysis are generated as output from the RTL platform. An area pie chart report displays a pie chart of the relative area of each of the partitions in the circuit design in a top window and an area percentage table of the partitions in a bottom window.

FIG. 17 illustrates an example of an area pie chart report according to an embodiment of the present invention. Shown in FIG. 17 are an area pie chart 1702 and an area percentage table 1704.

The user may select one of the partitions in the area pie chart 1702 to generate a display of simple instances in the design such as flip-flops, multiplexers, adders, and so on. This report assists the design engineer in identifying a high percentage of a specific element. For example, a nominal percentage of flip-flops in a circuit design is about 40 percent to 60 percent.

In step 114 of FIG. 1, the results of the analysis performed in step 112 are displayed in the result indicators 214 on the graphic user interface 200 in FIG. 2. The user may modify the RTL code to resolve the rule violations detected by the analysis, and the fail threshold values may be varied by the user from the option buttons 208 on the graphic user interface 200 to repeat the analysis under different conditions until a satisfactory RTL code design is achieved.

After being alerted to potential problems in the RTL code, the user may generate a cross-probing display to view the source of a problem in the layout, the schematic, and the RTL code concurrently.

Step 116 is the exit point of the flow chart 100.

Although the method of the present invention illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of the present invention.

The flow chart of FIG. 1 may be implemented according to well known computer programming techniques by for example, the software components shown in FIG. 19.

FIG. 18 illustrates an example of software components of a computer program for implementing the flow chart of FIG. 1. Shown in FIG. 18 are a library of RTL design rules 1802, an RTL code file 1804, a technology library 1806, a rule check module 1808, a rule violations report 1810, a rule violation analysis module 1812, and a report summary 1814. The library of RTL design rules 1802 may include, but is not limited to, the rules described in the examples above. The RTL code file 1804 is generated by the circuit designer. The technology library 1806 is specific to the chip architecture and is pre-defined for each chip technology according to well-known techniques. The rule check module or RTL platform 1809 receives the library of RTL design rules 1802, the RTL code file 1804, and the technology library 1806 and generates the rule violations report 1810 as described above with regard to the flowchart 100 of FIG. 1. The rule violation analysis module 1812 receives the rule violations report 1810 and generates the report summary 1814 in a workspace/reports directory of the RTL code folder. The report summary 1814 may also be displayed by the user to assist in modifying the RTL code file 1804 to optimize the circuit design.

In another aspect of the present invention, a computer program product for automatically analyzing RTL code includes a medium for embodying a computer program for input to a computer and a computer program embodied in the medium for causing the computer to perform the following functions:
 (a) receiving as input RTL code for an integrated circuit design;
 (b) selecting an RTL platform incorporating design rules for a vendor of the integrated circuit design;
 (c) displaying the design rules from the RTL platform on a graphic user interface;
 (d) selecting a number of the design rules from the graphic user interface;
 (e) performing an analysis in the RTL platform of the RTL code for each of the selected design rules; and
 (f) generating as output a result of the analysis for each of the selected design rules.

While the invention herein disclosed has been described by means of specific embodiments and applications thereof, numerous modifications and variations may be made thereto by those skilled in the art without departing from the scope of the invention set forth in the following claims.

What is claimed is:

1. A method of automatically analyzing RTL code comprising steps of:
 (a) receiving as input RTL code for an integrated circuit design;
 (b) selecting an RTL platform incorporating design rules for a vendor of the integrated circuit design;
 (c) displaying the design rules from the RTL platform on a graphic user interface;
 (d) selecting a number of the design rules from the graphic user interface for analyzing the RTL code;
 (e) performing an analysis in the RTL platform of the RTL code for each of the selected design rules; and
 (f) generating as output a result of the analysis for each of the selected design rules wherein step (d) further includes selecting one of a severity level and a threshold value for at least one of the selected design rules from the graphic user interface.

2. The method of claim 1 wherein the design rules selected from the graphic user interface include detecting and identifying a possible RTL coding problem consisting of at least one of missing clock information, unconstrained I/O, critical paths, time budgeting, large structures, local congestion, unused ports, floating pins, global congestion, latches, unregistered I/O, high fan-out nets, shift registers, logic depth, clock domain crossings, gate explosion, resource sharing, use of casex/casez, incomplete case statements, critical multiplexer structures, gated reset, asynchronous/combinational loops, multiple driven nets, logical cone fan-in, logical cone fan-out, and large arithmetic operators.

3. A computer program product for automatically analyzing RTL code comprising:
 a medium for embodying a computer program for input to a computer; and
 a computer program embodied in the medium for causing the computer to perform steps of:
  (a) receiving as input RTL code for an integrated circuit design;
  (b) selecting an RTL platform incorporating design rules for a vendor of the integrated circuit design;
  (c) displaying the design rules from the RTL platform on a graphic user interface;
  (d) selecting a number of the design rules from the graphic user interface for analyzing the RTL code;
  (e) performing an analysis in the RTL platform of the RTL code for each of the selected design rules; and
  (f) generating as output a result of the analysis for each of the selected design rules wherein step (d) further includes selecting one of a severity level and a threshold value for at least one of the selected design rules from the graphic user interface.

4. The computer program product of claim 3 wherein the design rules selected from the graphic user interface include detecting and identifying a possible RTL coding problem consisting of at least one of missing clock information, unconstrained I/O, critical paths, time budgeting, large structures, local congestion, unused ports, floating pins, global congestion, latches, unregistered I/O, high fan-out nets, shift registers, logic depth, clock domain crossings, gate explosion, resource sharing, use of casex/casez, incomplete case statements, critical multiplexer structures, gated reset, asynchronous/combinational loops, multiple driven nets, logical cone fan-in, logical cone fan-out, and large arithmetic operators.

* * * * *